US008415990B2

(12) United States Patent
Liu

(10) Patent No.: US 8,415,990 B2
(45) Date of Patent: Apr. 9, 2013

(54) GATE DRIVING CIRCUIT

(75) Inventor: Kang-Yi Liu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 57 days.

(21) Appl. No.: 13/281,451

(22) Filed: Oct. 26, 2011

(65) Prior Publication Data

US 2013/0002310 A1 Jan. 3, 2013

(30) Foreign Application Priority Data

Jun. 29, 2011 (TW) ............................. 100122854 A

(51) Int. Cl.
*H03K 3/00* (2006.01)

(52) U.S. Cl.
USPC .............................. 327/108; 327/77; 327/170

(58) Field of Classification Search ................... 327/108
See application file for complete search history.

(56) References Cited

U.S. PATENT DOCUMENTS 6,169,442 B1 * 1/2001 Meehan et al. ............... 327/513
7,825,889 B2 * 11/2010 Kim et al. ..................... 345/101
8,098,792 B2 * 1/2012 Hsu et al. ........................ 377/64
2007/0286004 A1 * 12/2007 Kim et al. ..................... 365/212
2008/0082291 A1 * 4/2008 Jeong et al. ................... 702/136
2008/0106322 A1 * 5/2008 Jeong ........................... 327/512
2009/0184901 A1 * 7/2009 Kwon ............................. 345/77
2009/0273591 A1 * 11/2009 Jinta ............................. 345/211
2010/0001943 A1 * 1/2010 Leo et al. ...................... 345/101
2010/0013817 A1 * 1/2010 Ryu et al. ...................... 345/211
2011/0298782 A1 * 12/2011 Park .............................. 345/212
2012/0200336 A1 * 8/2012 Ramaraju et al. ............. 327/512

FOREIGN PATENT DOCUMENTS

JP 2002335131 11/2002

* cited by examiner

*Primary Examiner* — Long Nguyen
*Assistant Examiner* — Patrick Chen
(74) *Attorney, Agent, or Firm* — Winston Hsu; Scott Margo

(57) ABSTRACT

A gate driving circuit includes a thermal sensing unit for sensing temperature to output a sensing voltage, a compare unit for comparing the sensing voltage with a reference voltage to output a control voltage, a charging control module for controlling a pre-charging operation according to the control voltage, and a plurality of shift register stages. Each shift register stage includes an input unit for outputting a driving control voltage according to a first input signal, a clock input unit for outputting a driving voltage according to a system clock, a driving unit for outputting a gate signal according to the driving control voltage and the driving voltage, and a pull-down unit for pulling down the gate signal and the driving control voltage according to a second input signal. The driving voltage is also controlled by the pre-charging operation for enhancing driving ability.

16 Claims, 4 Drawing Sheets

GATE DRIVING CIRCUIT

BACKGROUND OF THE INVENTION

1. Technical Field

The disclosure relates to a gate driving circuit, and more particularly, to a gate driving circuit having high driving ability.

2. Description of the Prior Art

Liquid crystal displays (LCDs) have advantages of a thin profile, low power consumption, and low radiation, and are broadly adopted for application in media players, mobile phones, personal digital assistants (PDAs), computer displays, and flat screen televisions. The operation of a liquid crystal display is featured by modulating the voltage drop across opposite sides of a liquid crystal layer for twisting the angles of liquid crystal molecules in the liquid crystal layer so that the transmittance of the liquid crystal layer can be controlled for illustrating images with the aid of light source provided by a backlight module. In general, the liquid crystal display comprises plural pixel units, a source driving circuit, and a gate driving circuit. The source driving circuit is utilized for providing plural data signals to be written into the pixel units. The gate driving circuit comprises a plurality of shift register stages and functions to generate plural gate signals for controlling the operations of writing the data signals into the pixel units. That is, the gate driving circuit is a crucial device for providing a control of writing the data signals into the pixel units.

However, in the operation of a prior-art gate driving circuit, each gate signal provided by one corresponding shift register stage is unable to make a rapid shift from low level voltage to high level voltage in response to the level switching of one corresponding system clock, and therefore it is hard to enhance the charging rate of pixel units. In certain design of the prior-art gate driving circuit, the size of driving transistor in each shift register stage is enlarged for enhancing pixel charging rate, which results in significantly higher power consumption. Besides, if the gate driving circuit is integrated in a display panel having pixel array to bring the cost down, i.e. based on a gate-driver on array (GOA) architecture, the aforementioned shift register stages are sequentially arranged in a lengthy border area of the display panel for each shift register stage to be connected directly to one corresponding gate line, which means that the shift register stages are distantly separated from each other and the phenomenon of signal propagation decay becomes worse accordingly. Further, because the driving transistors of the GOA shift register stages are amorphous-Si thin film transistors (TFTs) having low driving ability, the driving ability of the gate driving circuit also becomes worse. Finally, since the driving ability of amorphous-Si thin film transistors drops significantly following a decrease of temperature, the turned-on driving current of a driving transistor without sufficiently high drain-source voltage drop is hard to achieve high enough for performing real-time display operation while starting an LCD under low working temperature, which may even lead to an occurrence of LCD starting failure.

SUMMARY

In accordance with an embodiment, a gate driving circuit for providing plural gate signals to plural gate lines is disclosed. The gate driving circuit comprises a thermal sensing unit, a compare unit, a charging control module, and a plurality of shift register stages. The thermal sensing unit is employed to sense temperature for outputting a sensing voltage. The compare unit, electrically connected to the thermal sensing unit, is utilized for comparing the sensing voltage with a reference voltage so as to output a control voltage. The charging control module, electrically connected to the compare unit, is utilized for controlling a pre-charging operation according to the control voltage. The Nth shift register stage of the shift register stages comprises an input unit, a clock input unit, a driving unit, and a pull-down unit. The input unit is utilized for outputting a driving control voltage according to a first input signal. The clock input unit, electrically connected to the charging control module, is utilized for outputting a driving voltage according to a system clock. The driving voltage is further controlled by the charging control module. The driving unit, electrically connected to the input unit, the clock input unit, the charging control module and a corresponding gate line, for outputting a corresponding gate signal to the corresponding gate line according to the driving control voltage and the driving voltage. The pull-down unit, electrically connected to the input unit and the corresponding gate line, is put in use for pulling down the corresponding gate signal and the driving control voltage according to a second input signal.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, some embodiments of the present invention will be described in detail with reference to the accompanying drawings. Here, it is to be noted that the present invention is not limited thereto.

Figure 1:
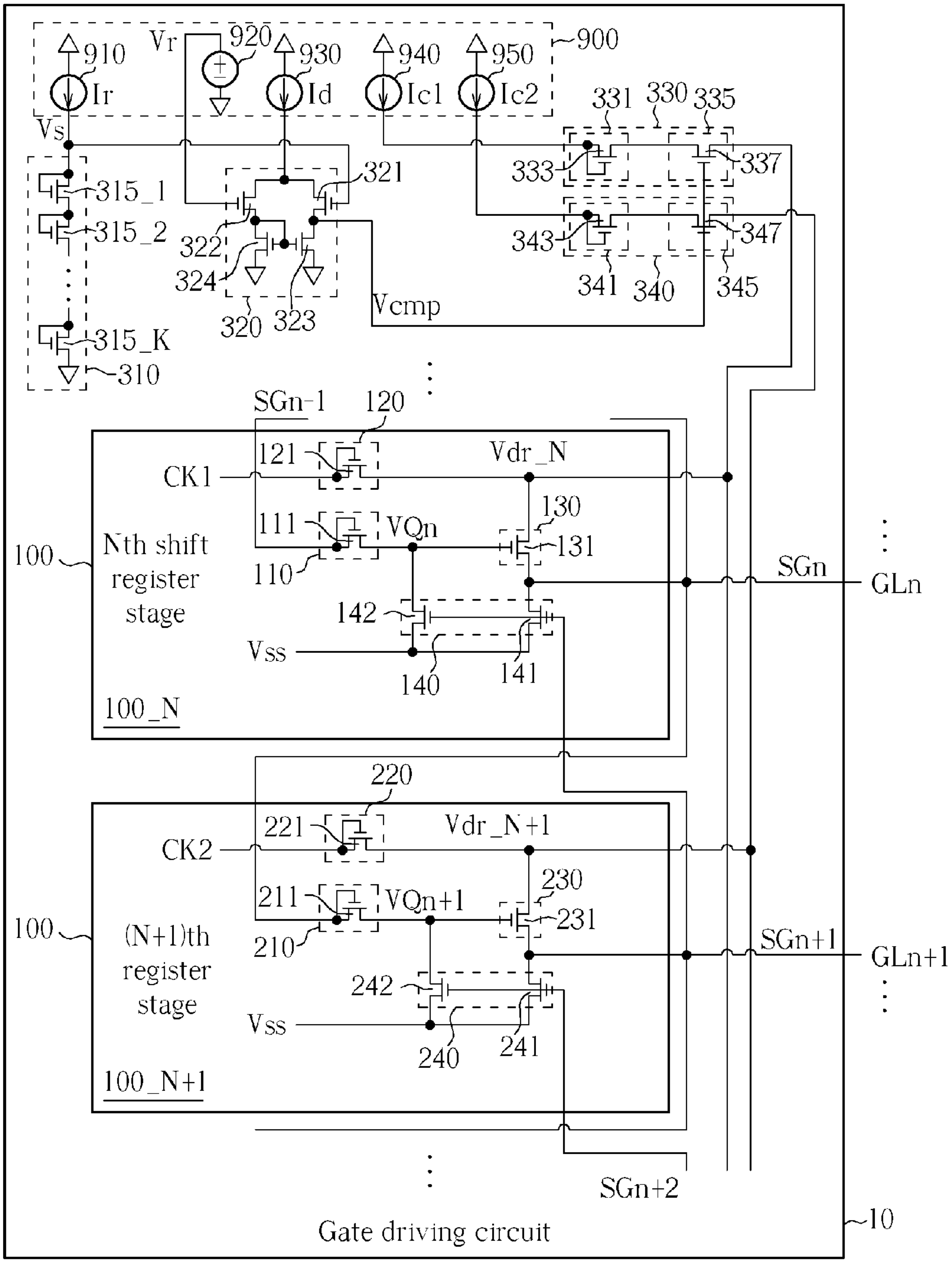
FIG. 1 is a schematic diagram showing a gate driving circuit in accordance with a first embodiment.

FIG. 1 is a schematic diagram showing a gate driving circuit 10 in accordance with a first embodiment. As shown in FIG. 1, the gate driving circuit 10 comprises a thermal sensing unit 310, a compare unit 320, a first charging control module 330, a second charging control module 340, a power module 900, and a plurality of shift register stages 100. The Nth shift register stage 100_N and the (N+1)th shift register stage 100_N+1 of the shift register stages 100 are illustrated for ease of explanation. The internal structures of other shift register stages 100 are similar to either the Nth shift register stage 100_N or the (N+1)th shift register stage 100_N+1, and can be inferred by analogy. The power module 900 comprises a first current source 910 for providing a reference current Ir, a voltage source 920 for providing a reference voltage Vr, a second current source 930 for providing a driving current Id, a third current source 940 for providing a first charging current Ic1, and a fourth current source 950 for providing a second charging current Ic2.

The thermal sensing unit 310, electrically connected to the first current source 910, is employed to sense temperature for outputting a sensing voltage Vs. The compare unit 320, electrically connected to the thermal sensing unit 310, the voltage source 920 and the second current source 930, is employed to compare the sensing voltage Vs with the reference voltage Vr for outputting a control voltage Vcmp. The first charging control module 330, electrically connected to the compare unit 320 and the third current source 940, is put in use for controlling a first pre-charging operation according to the control voltage Vcmp. The second charging control module 340, electrically connected to the compare unit 320 and the fourth current source 950, is put in use for controlling a second pre-charging operation according to the control voltage Vcmp. The Nth shift register stage 100_N is utilized for generating a gate signal SGn according to a gate signal SGn−1, a gate signal SGn+1 and a first clock CK1. The (N+1)th shift register stage 100_N+1 is utilized for generating the gate signal SGn+1 according to the gate signal SGn, a gate signal SGn+2 and a second clock CK2 having a phase opposite to the first clock CK1. It is noted that the gate signal scanning operation of the shift register stages 100 is not limited to the aforementioned two-clock driving mechanism, and the shift register stages 100 may employ prior-art four-clock driving mechanism to perform the gate signal scanning operation.

The Nth shift register stage 100_N comprises a first input unit 110, a first clock input unit 120, a first driving unit 130 and a first pull-down unit 140. The first input unit 110 is utilized for outputting a driving control voltage VQn according to the gate signal SGn−1. The first clock input unit 120, electrically connected to the first charging control module 330, is utilized for outputting the driving voltage Vdr_N according to the first clock CK1. The driving voltage Vdr_N is further controlled by the first pre-charging operation. The first driving unit 130, electrically connected to the first input unit 110, the first clock input unit 120, the first charging control module 330 and a gate line GLn, is utilized for outputting the gate signal SGn according to the driving control voltage VQn and the driving voltage Vdr_N. The gate line GLn is employed to transmit the gate signal SGn. The first pull-down unit 140, electrically connected to the first input unit 110 and the gate line GLn, is utilized for pulling down the gate signal SGn and the driving control voltage VQn according to the gate signal SGn+1.

The (N+1)th shift register stage 100_N+1 comprises a second input unit 210, a second clock input unit 220, a second driving unit 230 and a second pull-down unit 240. The second input unit 210, electrically connected to the Nth shift register stage 100_N, is utilized for outputting a driving control voltage VQn+1 according to the gate signal SGn. The second clock input unit 220, electrically connected to the second charging control module 340, is utilized for outputting the driving voltage Vdr_N+1 according to the second clock CK2. The driving voltage Vdr_N+1 is further controlled by the second pre-charging operation. The second driving unit 230, electrically connected to the second input unit 210, the second clock input unit 220, the second charging control module 340 and a gate line GLn+1, is utilized for outputting the gate signal SGn+1 according to the driving control voltage VQn+1 and the driving voltage Vdr_N+1. The gate line GLn+1 is employed to transmit the gate signal SGn+1. The second pull-down unit 240, electrically connected to the second input unit 210 and the gate line GLn+1, is utilized for pulling down the gate signal SGn+1 and the driving control voltage VQn+1 according to the gate signal SGn+2.

The first charging control module 330 comprises a first single-directional conducting unit 331 and a first current control unit 335. The first single-directional conducting unit 331, electrically connected to the third current source 940, is utilized for performing a single-directional conducting operation on the first charging current Ic1, thereby preventing an occurrence of reversing the first charging current Ic1 furnished backward to the third current source 940. The first current control unit 335, electrically connected to the compare unit 320, the first single-directional conducting unit 331, the first clock input unit 120 and the first driving unit 130, is employed to provide a control of performing the first pre-charging operation for pulling up the driving voltage Vdr_N according to the control voltage Vcmp and the first charging current Ic1.

The second charging control module 340 comprises a second single-directional conducting unit 341 and a second current control unit 345. The second single-directional conducting unit 341, electrically connected to the fourth current source 950, is utilized for performing a single-directional conducting operation on the second charging current Ic2, thereby preventing an occurrence of reversing the second charging current Ic2 furnished backward to the fourth current source 950. The second current control unit 345, electrically connected to the compare unit 320, the second single-directional conducting unit 341, the second clock input unit 220 and the second driving unit 230, is employed to provide a control of performing the second pre-charging operation for pulling up the driving voltage Vdr_N+1 according to the control voltage Vcmp and the second charging current Ic2.

In the embodiment shown in FIG. 1, the compare unit 320 comprises a first transistor 321, a second transistor 322, a third transistor 323 and a fourth transistor 324, the first single-directional conducting unit 331 comprises a fifth transistor 333, the first current control unit 335 comprises a sixth transistor 337, the second single-directional conducting unit 341 comprises a seventh transistor 343, the second current control unit 345 comprises an eighth transistor 347, the first clock input unit 120 comprises a ninth transistor 121, the first input unit 110 comprises a tenth transistor 111, the first driving unit 130 comprises an eleventh transistor 131, the first pull-down unit 140 comprises a twelfth transistor 141 and a thirteenth transistor 142, the second clock input unit 220 comprises a ninth transistor 221, the second input unit 210 comprises a tenth transistor 211, the second driving unit 230 comprises an eleventh transistor 231, and the second pull-down unit 240 comprises a twelfth transistor 241 and a thirteenth transistor 242. Besides, the thermal sensing unit 310 comprises a plurality of transistors 315_1-315_K connected in series. Each of the transistors 315_1-315_K comprises a first end for inputting the reference current Ir, a gate end electrically connected to the first end, and a second end for outputting the reference current Ir. Further, the first end of the transistors 315_1-315_K is electrically connected to the first current source 910 and is employed to output the sensing voltage Vs. Basically, the thermal sensing unit 310 provides a temperature sensing means through employing the variation of transistor threshold voltage with temperature for outputting the sensing voltage Vs. It is noted that each of the transistors aforementioned or to be mentioned may be a thin film transistor (TFT), a field effect transistor (FET) or other similar device having connection/disconnection switching functionality.

The first transistor 321 comprises a first end electrically connected to the second current source 930 for receiving the driving current Id, a gate end electrically connected to the thermal sensing unit 310 for receiving the sensing voltage Vs, and a second end for outputting the control voltage Vcmp. The second transistor 322 comprises a first end electrically connected to the first end of the first transistor 321, a gate end electrically connected to the voltage source 920 for receiving the reference voltage Vr, and a second end electrically connected to the third transistor 323 and the fourth transistor 324. The third transistor 323 comprises a first end electrically connected to the second end of the first transistor 321, a gate end electrically connected to the second end of the second transistor 322, and a second end for receiving power voltage. The fourth transistor 324 comprises a first end electrically connected to the second end of the second transistor 322, agate end electrically connected to the gate end of the third transistor 323, and a second end for receiving power voltage.

The fifth transistor 333 comprises a first end electrically connected to the third current source 940, a gate end electrically connected to the first end, and a second end electrically connected to the first current control unit 335. The sixth transistor 337 comprises a first end electrically connected to the second end of the fifth transistor 333, a gate end electrically connected to the compare unit 320 for receiving the control voltage Vcmp, and a second end electrically connected to the first clock input unit 120 and the first driving unit 130. The seventh transistor 343 comprises a first end electrically connected to the fourth current source 950, a gate end electrically connected to the first end, and a second end electrically connected to the second current control unit 345. The eighth transistor 347 comprises a first end electrically connected to the second end of the seventh transistor 343, a gate end electrically connected to the compare unit 320 for receiving the control voltage Vcmp, and a second end electrically connected to the second clock input unit 220 and the second driving unit 230.

The ninth transistor 121 comprises a first end for receiving the first clock CK1, a gate end electrically connected to the first end, and a second end for outputting the driving voltage Vdr_N. The tenth transistor 111 comprises a first end for receiving the gate signal SGn−1, a gate end electrically connected to the first end, and a second end for outputting the driving control voltage VQn. The eleventh transistor 131 comprises a first end electrically connected to the second end of the ninth transistor 121, a gate end electrically connected to the second end of the tenth transistor 111, and a second end electrically connected to the gate line GLn. The twelfth transistor 141 comprises a first end electrically connected to the gate line GLn, a gate end for receiving the gate signal SGn+1, and a second end for receiving a power voltage Vss. The thirteenth transistor 142 comprises a first end electrically connected to the second end of the tenth transistor 111, a gate end for receiving the gate signal SGn+1, and a second end for receiving the power voltage Vss.

The ninth transistor 221 comprises a first end for receiving the second clock CK2, a gate end electrically connected to the first end, and a second end for outputting the driving voltage Vdr_N+1. The tenth transistor 211 comprises a first end for receiving the gate signal SGn, a gate end electrically connected to the first end, and a second end for outputting the driving control voltage VQn+1. The eleventh transistor 231 comprises a first end electrically connected to the second end of the ninth transistor 221, a gate end electrically connected to the second end of the tenth transistor 211, and a second end electrically connected to the gate line GLn+1. The twelfth transistor 241 comprises a first end electrically connected to the gate line GLn+1, a gate end for receiving the gate signal SGn+2, and a second end for receiving the power voltage Vss. The thirteenth transistor 242 comprises a first end electrically connected to the second end of the tenth transistor 211, a gate end for receiving the gate signal SGn+2, and a second end for receiving the power voltage Vss.

Figure 2:
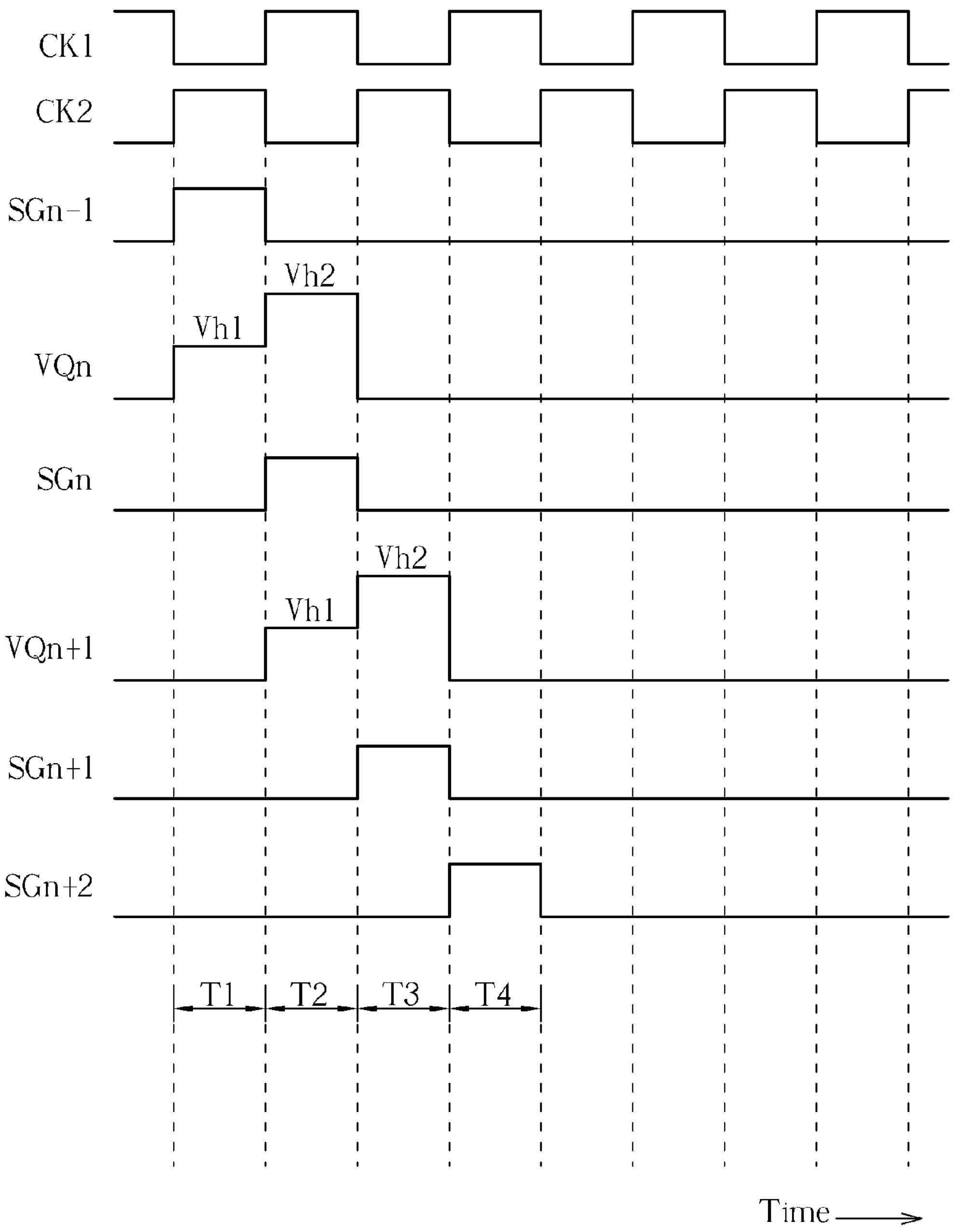
FIG. 2 is a schematic diagram showing related signal waveforms regarding the operation of the gate driving circuit illustrated in FIG. 1, having time along the abscissa.

FIG. 2 is a schematic diagram showing related signal waveforms regarding the operation of the gate driving circuit 10 illustrated in FIG. 1, having time along the abscissa. The signal waveforms in FIG. 2, from top to bottom, are the first clock CK1, the second clock CK2, the gate signal SGn−1, the driving control voltage VQn, the gate signal SGn, the driving control voltage VQn+1, the gate signal SGn+1, and the gate signal SGn+2. Referring to FIG. 2 in conjunction with FIG. 1, during an interval T1, the tenth transistor 111 is turned on by the gate signal SGn−1 having high level voltage, for pulling the driving control voltage VQn up to a first high voltage Vh1. During an interval T2, the ninth transistor 121 is turned on by the first clock CK1 having high level voltage, for pulling up the driving voltage Vdr_N. At this time, the rising edge of the driving voltage Vdr_N is employed to further boost the driving control voltage VQn to a second high voltage Vh2 through coupling of the device capacitor of the eleventh transistor 131, thereby turning on the eleventh transistor 131 for pulling up the gate signal SGn to high level voltage. Besides, the tenth transistor 211 is turned on by the gate signal SGn having high level voltage, for pulling the driving control voltage VQn+1 up to the first high voltage Vh1.

During an interval T3, the ninth transistor 221 is turned on by the second clock CK2 having high level voltage, for pulling up the driving voltage Vdr_N+1. At this time, the rising edge of the driving voltage Vdr_N+1 is employed to further boost the driving control voltage VQn+1 to the second high voltage Vh2 through coupling of the device capacitor of the eleventh transistor 231, thereby turning on the eleventh transistor 231 for pulling up the gate signal SGn+1 to high level voltage. Besides, the twelfth transistor 141 and the thirteenth transistor 142 are both turned on by the gate signal SGn+1 having high level voltage, for respectively pulling the gate signal SGn and the driving control voltage VQn down to the power voltage Vss. During an interval T4, the twelfth transistor 241 and the thirteenth transistor 242 are both turned on by the gate signal SGn+2 having high level voltage, for respectively pulling the gate signal SGn+1 and the driving control voltage VQn+1 down to the power voltage Vss.

Figure 3:
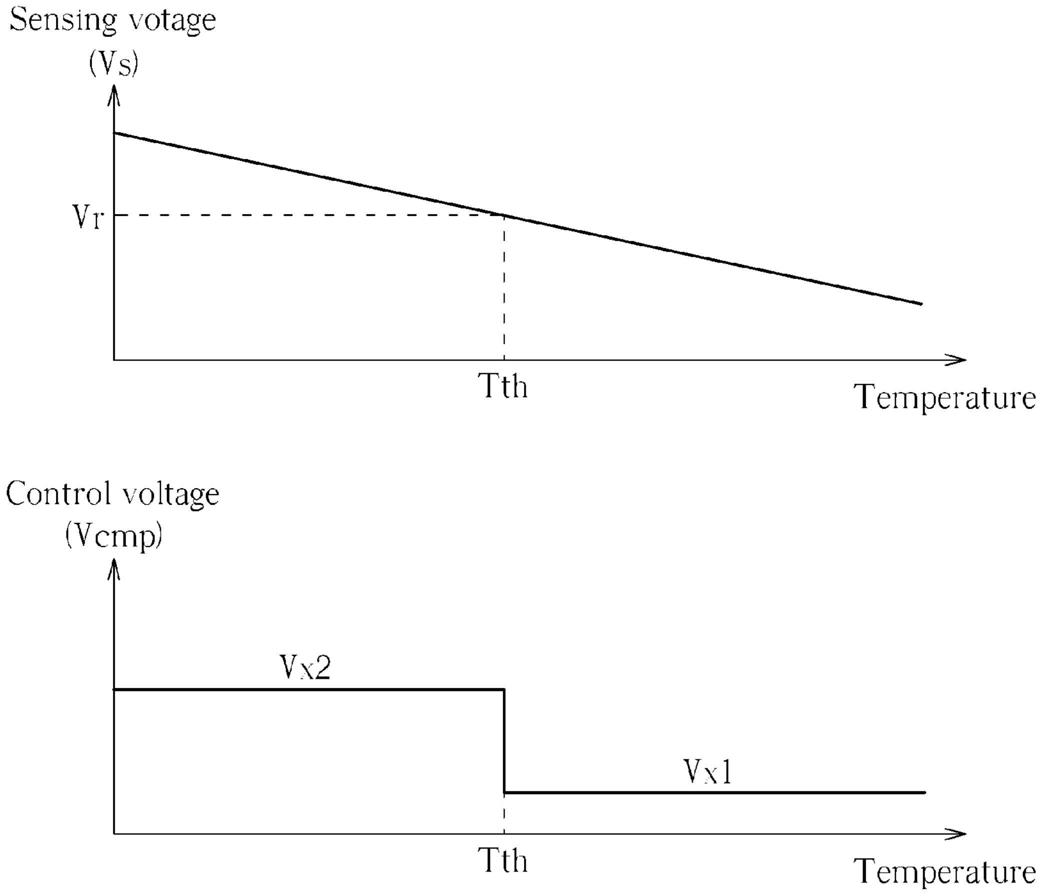
FIG. 3 is a schematic diagram showing the dependence of the sensing voltage and the control voltage on the working temperature of the gate driving circuit illustrated in FIG. 1.

FIG. 3 is a schematic diagram showing the dependence of the sensing voltage and the control voltage on the working temperature of the gate driving circuit 10 illustrated in FIG. 1, having temperature along the abscissa. Since the transistor threshold voltage increases following a decrease of the working temperature, the sensing voltage Vs increases when the working temperature decreases, as shown in FIG. 3. Referring to FIG. 1 through FIG. 3, when the working temperature is greater than a threshold temperature Tth, the sensing voltage Vs is lower than the reference voltage Vr, and the compare unit 320 outputs the control voltage Vcmp having a first voltage level Vx1 in response to the sensing voltage Vs lower than the reference voltage Vr. At this time, the shift register stages 100 are able to function properly without the aid of the first and second pre-charging operations, and the control voltage Vcmp having the first voltage level Vx1 is thus employed to turn off the sixth transistor 337 and the eighth transistor 347 for disabling the first and second pre-charging operations so as to reduce power consumption.

When the working temperature is less than the threshold temperature Tth, the sensing voltage Vs is greater than the reference voltage Vr, and the compare unit 320 outputs the control voltage Vcmp having a second voltage level Vx2 in response to the sensing voltage Vs greater than the reference voltage Vr. At this time, the shift register stages 100 may be unable to function properly without the aid of the first and second pre-charging operations, and the control voltage Vcmp having the second voltage level Vx2 is thus employed to turn on the sixth transistor 337 and the eighth transistor 347 for enabling the first and second pre-charging operations so as to enhance the driving ability of the shift register stages 100.

That is, in the operation of the gate driving circuit 10, during the interval T1 shown in FIG. 2, the driving voltage Vdr_N can be pre-boosted to high level voltage through performing the first pre-charging operation on the device capacitor of the eleventh transistor 131, thereby pre-boosting the drain-source voltage drop of the eleventh transistor 131. For that reason, during the interval T2, the eleventh transistor 131 turned on is able to provide high driving current in real time for performing real-time display operation. Similarly, during the interval T2 shown in FIG. 2, the driving voltage Vdr_N+1 can be pre-boosted to high level voltage through performing the second pre-charging operation on the device capacitor of the eleventh transistor 231, thereby pre-boosting the drain-source voltage drop of the eleventh transistor 231. Consequently, during the interval T3, the eleventh transistor 231 turned on is able to provide high driving current in real time for performing real-time display operation.

It is noted that the circuit operations of the first clock input unit 120 and the second clock input unit 220 are substantially equivalent to single-directional conducting operations. Accordingly, the ninth transistor 121 is turned off by the first clock CK1 having low level voltage during the interval T1, such that the first pre-charging operation is able to pre-boost the driving voltage Vdr_N to high level voltage. Similarly, the ninth transistor 221 is turned off by the second clock CK2 having low level voltage during the interval T2, such that the second pre-charging operation is able to pre-boost the driving voltage Vdr_N+1 to high level voltage. In summary, with the aid of the first and second pre-charging operations, while starting the gate driving circuit 10 under low working temperature, the driving ability of the shift register stages 100 can be significantly enhanced for achieving real-time display operation.

Figure 4:
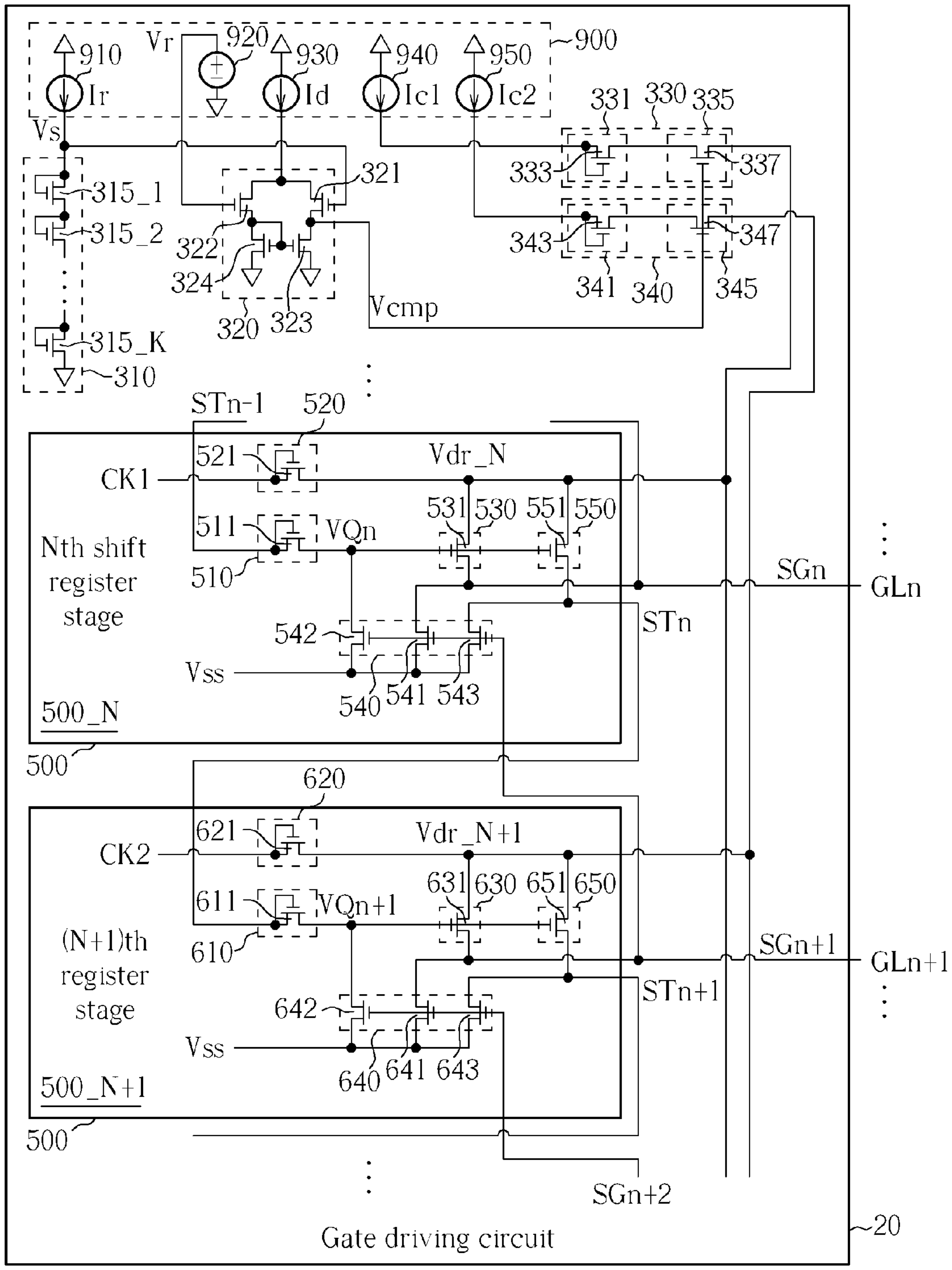
FIG. 4 is a schematic diagram showing a gate driving circuit in accordance with a second embodiment.

FIG. 4 is a schematic diagram showing a gate driving circuit 20 in accordance with a second embodiment. As shown in FIG. 4, the gate driving circuit 20 is similar to the gate driving circuit 10 illustrated in FIG. 1, differing in that the shift register stages 100 are replaced with a plurality of shift register stages 500, wherein the Nth shift register stage 100_N is replaced with an Nth shift register stage 500_N and the (N+1)th shift register stage 100_N+1 is replaced with an (N+1)th shift register stage 500_N+1. The Nth shift register stage 500_N is utilized for generating a gate signal SGn and a start pulse signal STn according to a start pulse signal STn−1, a gate signal SGn+1 and a first clock CK1. The (N+1)th shift register stage 500_N+1 is utilized for generating a gate signal SGn+1 and a start pulse signal STn+1 according to the start pulse signal STn, a gate signal SGn+2 and a second clock CK2 having a phase opposite to the first clock CK1. Besides, it is noted that the gate signal scanning operation of the shift register stages 500 is not limited to the aforementioned two-clock driving mechanism, and the shift register stages 500 may employ prior-art four-clock driving mechanism to perform the gate signal scanning operation.

The Nth shift register stage 500_N comprises a first input unit 510, a first clock input unit 520, a first driving unit 530, a first pull-down unit 540, and a first carry unit 550. The first input unit 510 is utilized for outputting a driving control voltage VQn according to the start pulse signal STn−1. The first clock input unit 520, electrically connected to the first charging control module 330, is utilized for outputting the driving voltage Vdr_N according to the first clock CK1. The driving voltage Vdr_N is further controlled by the first pre-charging operation. The first driving unit 530, electrically connected to the first input unit 510, the first clock input unit 520, the first charging control module 330 and a gate line GLn, is utilized for outputting the gate signal SGn according to the driving control voltage VQn and the driving voltage Vdr_N. The gate line GLn is employed to transmit the gate signal SGn. The first carry unit 550, electrically connected to the first input unit 510, the first clock input unit 520 and the first charging control module 330, is utilized for outputting the start pulse signal STn according to the driving control voltage VQn and the driving voltage Vdr_N. The first pull-down unit 540, electrically connected to the first input unit 510, the first carry unit 550 and the gate line GLn, is utilized for pulling down the gate signal SGn, the start pulse signal STn and the driving control voltage VQn according to the gate signal SGn+1. In another embodiment, the first pull-down unit 540 is utilized for pulling down the gate signal SGn, the start pulse signal STn and the driving control voltage VQn according to the start pulse signal STn+1.

The (N+1)th shift register stage 500_N+1 comprises a second input unit 610, a second clock input unit 620, a second driving unit 630, a second pull-down unit 640, and a second carry unit 650. The second input unit 610, electrically connected to the Nth shift register stage 500_N, is utilized for outputting a driving control voltage VQn+1 according to the start pulse signal STn. The second clock input unit 620, electrically connected to the second charging control module 340, is utilized for outputting the driving voltage Vdr_N+1 according to the second clock CK2. The driving voltage Vdr_N+1 is further controlled by the second pre-charging operation. The second driving unit 630, electrically connected to the second input unit 610, the second clock input unit 620, the second charging control module 340 and a gate line GLn+1, is utilized for outputting the gate signal SGn+1 according to the driving control voltage VQn+1 and the driving voltage Vdr_N+1. The gate line GLn+1 is employed to transmit the gate signal SGn+1. The second carry unit 650, electrically connected to the second input unit 610, the second clock input unit 620 and the second charging control module 340, is utilized for outputting the start pulse signal STn+1 according to the driving control voltage VQn+1 and the driving voltage Vdr_N+1. The second pull-down unit 640, electrically connected to the second input unit 610, the second carry unit 650 and the gate line GLn+1, is utilized for pulling down the gate signal SGn+1, the start pulse signal STn+1 and the driving control voltage VQn+1 according to the gate signal SGn+2. Similarly, in another embodiment, the second pull-down unit 640 is utilized for pulling down the gate signal SGn+1, the start pulse signal STn+1 and the driving control voltage VQn+1 according to the start pulse signal STn+2 (not shown).

In the embodiment shown in FIG. 4, the first clock input unit 520 comprises a ninth transistor 521, the first input unit 510 comprises a tenth transistor 511, the first driving unit 530 comprises an eleventh transistor 531, the first pull-down unit 540 comprises a twelfth transistor 541, a thirteenth transistor 542 and a fifteenth transistor 543, the first carry unit 550 comprises a fourteenth transistor 551, the second clock input unit 620 comprises a ninth transistor 621, the second input unit 610 comprises a tenth transistor 611, the second driving unit 630 comprises an eleventh transistor 631, the second pull-down unit 640 comprises a twelfth transistor 641, a thirteenth transistor 642 and a fifteenth transistor 643, and the second carry unit 650 comprises a fourteenth transistor 651.

The ninth transistor 521 comprises a first end for receiving the first clock CK1, a gate end electrically connected to the first end, and a second end for outputting the driving voltage Vdr_N. The tenth transistor 511 comprises a first end for receiving the start pulse signal STn−1, a gate end electrically connected to the first end, and a second end for outputting the driving control voltage VQn. The eleventh transistor 531 comprises a first end electrically connected to the second end of the ninth transistor 521, a gate end electrically connected to the second end of the tenth transistor 511, and a second end electrically connected to the gate line GLn. The fourteenth transistor 551 comprises a first end electrically connected to the second end of the ninth transistor 521, a gate end electrically connected to the second end of the tenth transistor 511, and a second end for outputting the start pulse signal STn. The twelfth transistor 541 comprises a first end electrically connected to the gate line GLn, a gate end for receiving the gate signal SGn+1, and a second end for receiving a power voltage Vss. The thirteenth transistor 542 comprises a first end electrically connected to the second end of the tenth transistor 511, a gate end electrically connected to the gate end of the twelfth transistor 541, and a second end for receiving the power voltage Vss. The fifteenth transistor 543 comprises a first end electrically connected to the second end of the fourteenth transistor 551, a gate end electrically connected to the gate end of the twelfth transistor 541, and a second end for receiving the power voltage Vss. In another embodiment, the gate end of the twelfth transistor 541 is employed to receive the start pulse signal STn+1.

The ninth transistor 621 comprises a first end for receiving the second clock CK2, a gate end electrically connected to the first end, and a second end for outputting the driving voltage Vdr_N+1. The tenth transistor 611 comprises a first end for receiving the start pulse signal STn, a gate end electrically connected to the first end, and a second end for outputting the driving control voltage VQn+1. The eleventh transistor 631 comprises a first end electrically connected to the second end of the ninth transistor 621, a gate end electrically connected to the second end of the tenth transistor 611, and a second end electrically connected to the gate line GLn+1. The fourteenth transistor 651 comprises a first end electrically connected to the second end of the ninth transistor 621, a gate end electrically connected to the second end of the tenth transistor 611, and a second end for outputting the start pulse signal STn+1. The twelfth transistor 641 comprises a first end electrically connected to the gate line GLn+1, agate end for receiving the gate signal SGn+2, and a second end for receiving the power voltage Vss. The thirteenth transistor 642 comprises a first end electrically connected to the second end of the tenth transistor 611, a gate end electrically connected to the gate end of the twelfth transistor 641, and a second end for receiving the power voltage Vss. The fifteenth transistor 643 comprises a first end electrically connected to the second end of the fourteenth transistor 651, a gate end electrically connected to the gate end of the twelfth transistor 641, and a second end for receiving the power voltage Vss. Similarly, in another embodiment, the gate end of the twelfth transistor 641 is employed to receive the start pulse signal STn+2(not shown).

In the circuit operation of the gate driving circuit 20, when the working temperature is greater than the threshold temperature Tth, the first charging control module 330 and the second charging module 340 cease performing the first and second pre-charging operations respectively for reducing power consumption. When the working temperature is less than the threshold temperature Tth, the first charging control module 330 and the second charging module 340 perform the first and second pre-charging operations respectively for enhancing the driving ability of the shift register stages 500, such that the gate signals and the start pulse signals are able to shift voltage levels promptly in response to the level switching of system clocks. That is, while starting the gate driving circuit 20 under low working temperature, the driving ability of the shift register stages 500 can be significantly enhanced for achieving real-time display operation.

In conclusion, with the aid of the first and second pre-charging operations, the driving ability of the gate driving circuit according to the present invention can be significantly enhanced for performing real-time display operation while starting an LCD under low working temperature.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A gate driving circuit for providing plural gate signals to plural gate lines, the gate driving circuit comprising:

a thermal sensing unit for sensing temperature to output a sensing voltage;

a compare unit, electrically connected to the thermal sensing unit, for comparing the sensing voltage with a reference voltage to output a control voltage;

a first charging control module, electrically connected to the compare unit, for controlling a first pre-charging operation according to the control voltage; and a plurality of shift register stages, an Nth shift register stage of the plurality of shift register stages comprising:

a first input unit for outputting an Nth driving control voltage according to a first input signal;

a first clock input unit, electrically connected to the first charging control module, for outputting an Nth driving voltage according to a first clock, wherein the Nth driving voltage is further controlled by the first charging control module;

a first driving unit, electrically connected to the first input unit, the first clock input unit, the first charging control module and an Nth gate line of the gate lines, for outputting an Nth gate signal of the gate signals according to the Nth driving control voltage and the Nth driving voltage, wherein the Nth gate line is employed to transmit the Nth gate signal; and a first pull-down unit, electrically connected to the first input unit and the Nth gate line, for pulling down the Nth gate signal and the Nth driving control voltage according to a second input signal.

2. The gate driving circuit of claim 1, further comprising a current source for providing a reference current, wherein the thermal sensing unit comprises:

a plurality of transistors connected in series, each of the transistors having a first end for inputting the reference current, a gate end electrically connected to the first end, and a second end for outputting the reference current, wherein the first end of the transistors is employed to output the sensing voltage.

3. The gate driving circuit of claim 1, further comprising a current source for providing a driving current, wherein the compare unit comprises:

a first transistor having a first end electrically connected to the current source for receiving the driving current, a gate end electrically connected to the thermal sensing unit for receiving the sensing voltage, and a second end for outputting the control voltage;

a second transistor having a first end electrically connected to the first end of the first transistor, a gate end for receiving the reference voltage, and a second end;

a third transistor having a first end electrically connected to the second end of the first transistor, a gate end electrically connected to the second end of the second transistor, and a second end for receiving a power voltage; and a fourth transistor having a first end electrically connected to the second end of the second transistor, a gate end electrically connected to the second end of the second transistor, and a second end for receiving the power voltage.

4. The gate driving circuit of claim 1, further comprising a current source for providing a first charging current, wherein the first charging control module comprises:

a first single-directional conducting unit, electrically connected to the current source, for performing a single-directional conducting operation on the first charging current; and a first current control unit, electrically connected to the compare unit, the first single-directional conducting unit, the first clock input unit and the first driving unit, for providing a control of performing the first pre-charging operation for pulling up the Nth driving voltage according to the control voltage and the first charging current.

5. The gate driving circuit of claim 4, wherein:

the first single-directional conducting unit comprises a fifth transistor having a first end electrically connected to the current source, a gate end electrically connected to the first end, and a second end electrically connected to the first current control unit; and the first current control unit comprises a sixth transistor having a first end electrically connected to the second end of the fifth transistor, a gate end for receiving the control voltage, and a second end electrically connected to the first clock input unit and the first driving unit.

6. The gate driving circuit of claim 1, wherein the first clock input unit comprises:

a ninth transistor having a first end for receiving the first clock, a gate end electrically connected to the first end, and a second end for outputting the Nth driving voltage.

7. The gate driving circuit of claim 1, wherein:

the first input unit comprises a tenth transistor having a first end for receiving the first input signal, a gate end electrically connected to the first end, and a second end for outputting the Nth driving control voltage; and the first pull-down unit comprises:

a twelfth transistor having a first end electrically connected to the Nth gate line, a gate end for receiving the second input signal, and a second end for receiving a power voltage; and a thirteenth transistor having a first end electrically connected to the first input unit, a gate end for receiving the second input signal, and a second end for receiving the power voltage;

wherein the first input signal is an (N−1)th gate signal of the gate signals, and the second input signal is an (N+1)th gate signal of the gate signals.

8. The gate driving circuit of claim 1, wherein the first driving unit comprises:

an eleventh transistor having a first end electrically connected to the first clock input unit and the first charging control module, a gate end electrically connected to the first input unit, and a second end electrically connected to the Nth gate line.

9. The gate driving circuit of claim 1, wherein the Nth shift register stage further comprises:

a first carry unit, electrically connected to the first input unit, the first clock input unit and the first charging control module, for outputting an Nth start pulse signal according to the Nth driving control voltage and the Nth driving voltage;

wherein the first pull-down unit is further employed to pull down the Nth start pulse signal according to the second input signal, the first input signal is an (N−1)th start pulse signal, and the second input signal is an (N+1)th start pulse signal or an (N+1)th gate signal of the gate signals.

10. The gate driving circuit of claim 9, wherein:

the first carry unit comprises a fourteenth transistor having a first end electrically connected to the first clock input unit and the first charging control module, a gate end electrically connected to the first input unit, and a second end for outputting the Nth start pulse signal; and the first pull-down unit comprises:

a twelfth transistor having a first end electrically connected to the Nth gate line, a gate end for receiving the second input signal, and a second end for receiving a power voltage;

a thirteenth transistor having a first end electrically connected to the first input unit, a gate end for receiving the second input signal, and a second end for receiving the power voltage; and a fifteenth transistor having a first end electrically connected to the second end of the fourteenth transistor, a gate end for receiving the second input signal, and a second end for receiving the power voltage.

11. The gate driving circuit of claim 1, further comprising a second charging control module, electrically connected to the compare unit, for controlling a second pre-charging operation according to the control voltage, wherein an (N+1)th shift register stage of the shift register stages comprises:

a second input unit, electrically connected to the Nth shift register stage, for outputting an (N+1)th driving control voltage according to a third input signal;

a second clock input unit, electrically connected to the second charging control module, for outputting an (N+1)th driving voltage according to a second clock having a phase opposite to the first clock, wherein the (N+1)th driving voltage is further controlled by the second pre-charging operation;

a second driving unit, electrically connected to the second input unit, the second clock input unit, the second charging control module and an (N+1)th gate line of the gate lines, for outputting an (N+1)th gate signal of the gate signals according to the (N+1)th driving control voltage and the (N+1)th driving voltage, wherein the (N+1)th gate line is employed to transmit the (N+1)th gate signal; and a second pull-down unit, electrically connected to the second input unit and the (N+1)th gate line, for pulling down the (N+1)th gate signal and the (N+1)th driving control voltage according to a fourth input signal.

12. The gate driving circuit of claim 11, further comprising a current source for providing a second charging current, wherein the second charging control module comprises:

a second single-directional conducting unit, electrically connected to the current source, for performing a single-directional conducting operation on the second charging current; and a second current control unit, electrically connected to the compare unit, the second single-directional conducting unit, the second clock input unit and the second driving unit, for providing a control of performing the second pre-charging operation for pulling up the (N+1)th driving voltage according to the control voltage and the second charging current.

13. The gate driving circuit of claim 12, wherein:

the second single-directional conducting unit comprises a seventh transistor having a first end electrically connected to the current source, a gate end electrically connected to the first end, and a second end electrically connected to the second current control unit; and the second current control unit comprises an eighth transistor having a first end electrically connected to the second end of the seventh transistor, a gate end for receiving the control voltage, and a second end electrically connected to the second clock input unit and the second driving unit.

14. The gate driving circuit of claim 11, wherein the third input signal is the Nth gate signal, and the fourth input signal is an (N+2)th gate signal of the gate signals.

15. The gate driving circuit of claim 11, wherein the (N+1)th shift register stage further comprises:

a second carry unit, electrically connected to the second input unit, the second clock input unit and the second charging control module, for outputting an (N+1)th start pulse signal according to the (N+1)th driving control voltage and the (N+1)th driving voltage;

wherein the second pull-down unit is further employed to pull down the (N+1)th start pulse signal according to the fourth input signal.

16. The gate driving circuit of claim 15, wherein the third input signal is an Nth start pulse signal, and the fourth input signal is an (N+2)th start pulse signal or an (N+2)th gate signal of the gate signals.

* * * * *